(12) United States Patent
Noguchi

(10) Patent No.: US 12,506,466 B2
(45) Date of Patent: Dec. 23, 2025

(54) ACOUSTIC WAVE FILTER

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 231 days.

(21) Appl. No.: 18/231,918

(22) Filed: Aug. 9, 2023

(65) Prior Publication Data

US 2023/0387886 A1   Nov. 30, 2023

Related U.S. Application Data

(63) Continuation of application No. PCT/JP2022/007114, filed on Feb. 22, 2022.

(30) Foreign Application Priority Data

Feb. 24, 2021   (JP) .................................. 2021-027380

(51) Int. Cl.
*H03H 9/64* (2006.01)
*H03H 9/02* (2006.01)
*H03H 9/145* (2006.01)

(52) U.S. Cl.
CPC ...... *H03H 9/6483* (2013.01); *H03H 9/02574* (2013.01); *H03H 9/14508* (2013.01)

(58) Field of Classification Search
CPC ............... H03H 9/6436; H03H 9/6483; H03H 9/14508; H03H 9/02574
See application file for complete search history.

(56) References Cited

U.S. PATENT DOCUMENTS

| | | | | |
|---|---|---|---|---|
| 9,118,303 | B2 * | 8/2015 | Inoue | H03H 9/6483 |
| 10,069,476 | B2 * | 9/2018 | Hara | H03H 9/6479 |
| 2017/0331456 | A1 * | 11/2017 | Ono | H03H 9/725 |
| 2018/0131348 | A1 * | 5/2018 | Takahashi | H03H 9/1457 |

(Continued)

FOREIGN PATENT DOCUMENTS

| | | |
|---|---|---|
| JP | 2018074539 A | 5/2018 |
| JP | 2018078489 A | 5/2018 |

(Continued)

OTHER PUBLICATIONS

International Search Report in PCT/JP2022/007114, mailed Apr. 26, 2022, 3 pages.

(Continued)

*Primary Examiner* — Quan Tra
(74) *Attorney, Agent, or Firm* — Keating & Bennett, LLP

(57) ABSTRACT

An acoustic wave filter includes a filter circuit connected to input-and-output terminals, and a canceling circuit connected in parallel to at least a portion of a first path connecting the input-and-output terminals. The filter circuit includes one or more series-arm resonators on the first path, and one or more parallel-arm resonators between the first path and a ground. The canceling circuit includes acoustic wave resonators in parallel or substantially in parallel in a propagation direction of an acoustic wave. At least one of the acoustic wave resonators is connected to the ground, and an anti-resonant frequency of the at least one of the acoustic wave resonators is in a pass band of the filter circuit.

20 Claims, 7 Drawing Sheets

(56) References Cited

U.S. PATENT DOCUMENTS

| | | | |
|---|---|---|---|
| 2018/0131349 A1* | 5/2018 | Takata | H03H 9/6483 |
| 2018/0152191 A1 | 5/2018 | Niwa et al. | |
| 2018/0234079 A1* | 8/2018 | Takamine | H03H 7/38 |
| 2021/0021256 A1 | 1/2021 | Okada | |

FOREIGN PATENT DOCUMENTS

| | | |
|---|---|---|
| JP | 2018088678 A | 6/2018 |
| JP | 2021016116 A | 2/2021 |

OTHER PUBLICATIONS

Written Opinion in PCT/JP2022/007114, mailed Apr. 26, 2022, 3 pages.

* cited by examiner

ACOUSTIC WAVE FILTER

CROSS REFERENCE TO RELATED APPLICATIONS

This application claims the benefit of priority to Japanese Patent Application No. 2021-027380 filed on Feb. 24, 2021 and is a Continuation Application of PCT Application No. PCT/JP2022/007114 filed on Feb. 22, 2022. The entire contents of each application are hereby incorporated herein by reference.

BACKGROUND OF THE INVENTION

1. Field of the Invention

The present invention relates to an acoustic wave filter.

2. Description of the Related Art

Japanese Unexamined Patent Application Publication No. 2018-74539 discloses a circuit configuration of a multiplexer provided with a transmission-side filter and a reception-side filter. The transmission-side filter has an input-and-output terminal to which an additional circuit which cancels a component flowing in the transmission-side filter in a given frequency band is connected. This configuration can improve attenuation characteristics of the transmission-side filter in the given frequency band.

However, in the multiplexer described in Japanese Unexamined Patent Application Publication No. 2018-74539, although the attenuation characteristics of the transmission-side filter are improved, the additional circuit is disposed independently from the transmission-side filter and the reception-side filter, and thus the size of the transmission-side filter and the multiplexer is increased.

SUMMARY OF THE INVENTION

Preferred embodiments of the present invention provide acoustic wave filters each of which is reduced in size while improving attenuation characteristics thereof.

An acoustic wave filter according to a preferred embodiment of the present invention includes a first circuit connected to a first terminal and a second terminal, and a second circuit connected in parallel to at least a portion of a first path connecting the first terminal and the second terminal. The first circuit includes one or more series-arm resonators on the first path and one or more parallel-arm resonators between the first path and a ground. The second circuit includes a plurality of first acoustic wave resonators in parallel or substantially in parallel in a propagation direction of an acoustic wave. At least one of the plurality of first acoustic wave resonators is connected to a ground. An anti-resonant frequency of the at least one of the plurality of first acoustic wave resonators is in a pass band of the first circuit.

According to preferred embodiments of the present invention, acoustic wave filters each of which is reduced in size while improving attenuation characteristics thereof are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
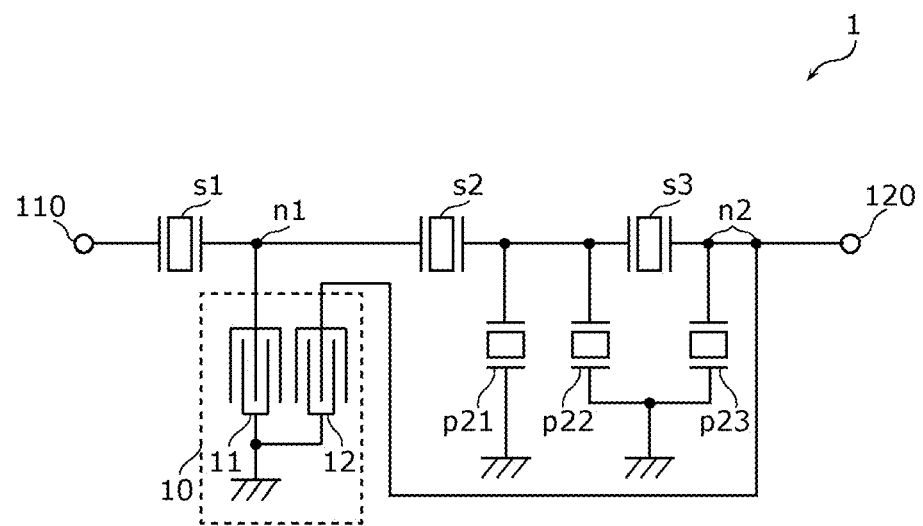
FIG. 1 is a circuit configuration diagram of an acoustic wave filter according to a preferred embodiment of the present invention.

Hereinafter, preferred embodiments of the present invention are described in detail with reference to examples and the drawings. Each example described below illustrates comprehensive or concrete examples. Numerical values, shapes, material, components, and arrangement and connection configurations of the components described in the following examples are merely examples, and not intended to limit the present invention. Among the components in the following examples, components not described in the independent claim are described as arbitrary or optional components. Moreover, the sizes or the size ratios of the components illustrated in the drawings are not necessarily exact.

Furthermore, in the present disclosure, "being connected" includes not only a case of being directly connected using a connection terminal and/or a wiring conductor, but also a case of being electrically connected with another circuit device interposed. Moreover, "being connected between A and B" means to be connected to A and B on a path connecting A and B.

PREFERRED EMBODIMENT

1. Circuit Configuration of Acoustic Wave Filter 1

FIG. 1 is a circuit configuration diagram of an acoustic wave filter 1 according to a preferred embodiment of the present invention. As illustrated in FIG. 1, the acoustic wave filter 1 includes input-and-output terminals 110 and 120, series-arm resonators s1, s2, and s3, parallel-arm resonators p21, p22, and p23, and a canceling circuit 10.

Each of the series-arm resonators s1, s2, and s3 is an acoustic wave resonator, and is disposed on a first path connecting the input-and-output terminal 110 (first terminal) and the input-and-output terminal 120 (second terminal).

Each of the parallel-arm resonators p21, p22, and p23 is an acoustic wave resonator, and is disposed between a node on the first path and a ground.

The canceling circuit 10 is one example of a second circuit and includes longitudinally coupled acoustic wave resonators 11 and 12 disposed on a second path connecting a node n1 and a node n2. In other words, the canceling circuit 10 is connected in parallel to at least a portion of the first path. The node n1 is a node on wiring connecting the series-arm resonator s1 and the series-arm resonator s2, and the node n2 is a node on wiring connecting the series-arm resonator s3 and the input-and-output terminal 120. Each of the acoustic wave resonators 11 and 12 is one example of a first acoustic wave resonator, and they are disposed in parallel or substantially in parallel in a propagation direction of an acoustic wave. Each of the acoustic wave resonators 11 and 12 is an acoustic wave resonator including an IDT electrode provided on a substrate having piezoelectricity. The IDT electrode which defines the acoustic wave resonator 11 includes two comb-shaped electrodes opposed to each other. One comb-shaped electrode is connected to the node n1 and the other comb-shaped electrode is connected to the ground. Moreover, the IDT electrode which defines the acoustic wave resonator 12 includes two comb-shaped electrodes opposed to each other. One comb-shaped electrode is connected to the node n2 and the other comb-shaped electrode is connected to the ground.

Reflectors may be disposed at positions adjacent to the acoustic wave resonators 11 and 12 in the acoustic wave propagation direction.

Moreover, the canceling circuit 10 may include, for example, instead of the acoustic wave resonators 11 and 12, transversal acoustic wave resonators which transmit a signal by utilizing propagation of a surface acoustic wave between IDT electrodes.

The nodes n1 and n2 to which the canceling circuit 10 is connected may be any node on the first path and disposed with at least one series-arm resonator interposed therebetween.

In the present preferred embodiment, the node n1 and the node n2 are two separate nodes. "Two separate nodes" means that the two nodes are connected to each other with an impedance element (for example, an inductor, a capacitor, a resistor, or a resonator) interposed therebetween.

In the acoustic wave filter 1, the series-arm resonators s1, s2, and s3, the parallel-arm resonators p21, p22, and p23, and the acoustic wave resonator 11 define a first circuit (filter circuit). An anti-resonant frequency of the acoustic wave resonator 11 is in a pass band of the filter circuit.

In the present preferred embodiment, the pass band of the filter is defined to be one of (1) a standard band of a communication band applied to the filter, and (2) a frequency band at or higher than a lower cutoff frequency (f1L) of the filter and at or lower than a higher cutoff frequency (f1H). The lower cutoff frequency f1L and the higher cutoff frequency f1H are respectively a lower-side frequency and a higher-sider frequency at which an insertion loss increases by, for example, about 3 dB when compared to the minimum value of the insertion loss in bandpass characteristics of the filter.

The canceling circuit 10 can generate, in the acoustic wave resonators 11 and 12, a signal in a phase opposite or substantially opposite from a signal which passes the filter circuit in a given frequency band. Therefore, the canceling circuit 10 can reduce or prevent a signal which flows on the first path in the given frequency band.

In the configuration of the acoustic wave filter 1 described above, the canceling circuit 10 can improve attenuation of the filter circuit in a given attenuation band. Moreover, since the acoustic wave resonator 11 can define and function as the parallel-arm resonator of the filter circuit, which should be disposed between the node n1 and the ground, the number of parallel-arm resonators of the filter circuit can be reduced. Thus, the acoustic wave filter 1 having improved attenuation characteristics and being reduced in size can be obtained.

Moreover, in the acoustic wave filter 1, the resonant frequency of the acoustic wave resonator 11 is desirably on the lower frequency side than the pass band of the filter circuit.

As a result, the resonant frequency of the acoustic wave resonator 11 can define and function as a parallel-arm resonator which secures attenuation of the filter circuit on the lower frequency side.

The number of series-arm resonators of the acoustic wave filter 1 may be any number as long as it is one or more. Moreover, the number of parallel-arm resonators of the acoustic wave filter 1 may be any number as long as it is one or more. The acoustic wave filter 1 may be any filter, such as, for example, a ladder filter.

Here, a basic structure of the series-arm resonators s1, s2, and s3, the parallel-arm resonators p21, p22, and p23, and the acoustic wave resonators 11 and 12 is described.

2. Structure of Acoustic Wave Resonator

Figure 2A:
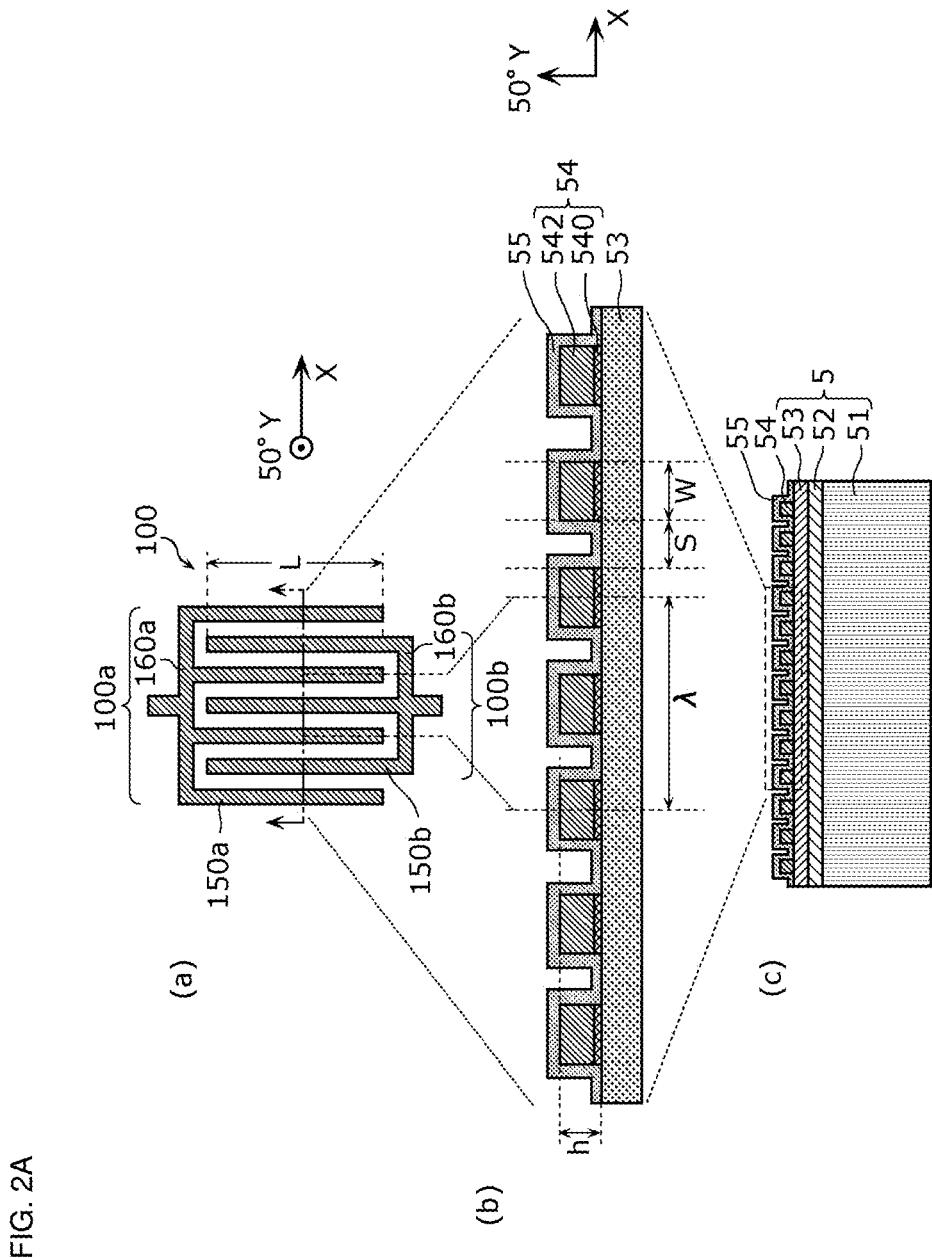
FIG. 2A is a plan view and a sectional view illustrating a first example of a structure of an acoustic wave resonator according to a preferred embodiment of the present invention.

FIG. 2A is a schematic view illustrating a first example of a structure of an acoustic wave resonator according to the present preferred embodiment, where (a) is a plan view, and (b) and (c) are sectional views taken along a one-dot chain line indicated in (a). In FIG. 2A, an acoustic wave resonator 100 having a basic structure of the series-arm resonator, the parallel-arm resonator, and the acoustic wave resonator which define the acoustic wave filter 1 is exemplified. The acoustic wave resonator 100 illustrated in FIG. 2A is to explain a typical structure of the acoustic wave resonator, and the number and a length of electrode fingers of an electrode are not limited to those illustrated in FIG. 2A.

The acoustic wave resonator 100 includes a substrate 5 having piezoelectricity and comb-shaped electrodes 100$a$ and 100$b$.

As illustrated in (a) in FIG. 2A, a pair of comb-shaped electrodes 100$a$ and 100$b$ opposed to each other are provided on the substrate 5. The comb-shaped electrode 100$a$ includes a plurality of electrode fingers 150$a$ parallel or substantially parallel to each other and a busbar electrode 160$a$ connecting the plurality of electrode fingers 150$a$. Moreover, the comb-shaped electrode 100$b$ includes a plurality of electrode fingers 150$b$ parallel or substantially parallel to each other and a busbar electrode 160$b$ connecting the plurality of electrode fingers 150$b$. The plurality of electrode fingers 150$a$ and 150$b$ are provided along a direction orthogonal or substantially orthogonal to the acoustic wave propagation direction (X-axis direction).

Moreover, an interdigital transducer (IDT) electrode 54 including the plurality of electrode fingers 150$a$ and 150$b$, and the busbar electrodes 160$a$ and 160$b$ has a multilayer structure including an adhesion layer 540 and a main electrode layer 542 as illustrated in (b) in FIG. 2A.

The adhesion layer 540 is a layer to improve adhesiveness between the substrate 5 and the main electrode layer 542, and, for example, Ti is used as a material. A film thickness of the adhesion layer 540 is about 12 nm, for example.

As material of the main electrode layer 542, for example, Al including about 1% of Cu is used. A film thickness of the main electrode layer 542 is about 162 nm, for example.

A protection layer 55 covers the comb-shaped electrodes 100a and 100b. The protection layer 55 is a layer to protect the main electrode layer 542 from external environment, adjust frequency temperature characteristics, and improve moisture resistance, and is, for example, a dielectric film including silicon dioxide as a major component. A thickness of the protection layer 55 is about 25 nm, for example.

The materials of the adhesion layer 540, the main electrode layer 542, and the protection layer 55 is not limited to the materials described above. Moreover, the IDT electrode 54 does not necessarily have the multilayer structure described above. The IDT electrode 54 may be made of metal (for example, Ti, Al, Cu, Pt, Au, Ag, or Pd) or alloy, or alternatively, it may include a plurality of multilayer bodies made of metal or alloy described above. Moreover, the protection layer 55 is not necessarily provided.

Next, a multilayer structure of the substrate 5 is described. As illustrated in (c) in FIG. 2A, the substrate 5 includes a high-acoustic-velocity support substrate 51, a low-acoustic-velocity film 52, and a piezoelectric film 53, and has a structure in which the high-acoustic-velocity support substrate 51, the low-acoustic-velocity film 52, and the piezoelectric film 53 are laminated in this order.

The piezoelectric film 53 is made of, for example, a 50° Y-cut X propagation LiTaO$_3$ piezoelectric single crystal, or piezoelectric ceramics (a lithium tantalate single crystal or ceramics which is cut along a surface having its normal line at an axis rotated by about 50° from a Y axis about an X-axis as a center axis, and in which a surface acoustic wave propagates in an X-axis direction). A thickness of the piezoelectric film 53 is about 600 nm, for example. The material and cut-angles of the piezoelectric single crystal used as the piezoelectric film 53 is suitably selected in accordance with required specifications of each filter.

The high-acoustic-velocity support substrate 51 is a substrate which supports the low-acoustic-velocity film 52, the piezoelectric film 53, and the IDT electrode 54. The high-acoustic-velocity support substrate 51 is further a substrate in which an acoustic velocity of a bulk wave in the high-acoustic-velocity support substrate 51 is higher than an acoustic velocity of an acoustic wave such as a surface acoustic wave and a boundary wave which propagates on/in the piezoelectric film 53, and functions to confine the surface acoustic wave in the laminated portion of the piezoelectric film 53 and the low-acoustic-velocity film 52 not to leak to the high-acoustic-velocity support substrate 51 and below. For example, the high-acoustic-velocity support substrate 51 is a silicon substrate and a thickness thereof is about 200 μm.

The low-acoustic-velocity film 52 is a film in which an acoustic velocity of a bulk wave in the low-acoustic-velocity film 52 is lower than an acoustic velocity of a bulk wave which propagates in the piezoelectric film 53, and is disposed between the piezoelectric film 53 and the high-acoustic-velocity support substrate 51. By this structure, and a nature that an acoustic wave energy essentially concentrates on a lower acoustic velocity medium, leaking of the surface acoustic wave energy to the outside of the IDT electrode is suppressed. For example, the low-acoustic-velocity film 52 is a film including silicon dioxide as a major component and a thickness thereof is about 670 nm.

In the multilayer structure of the substrate 5, quality factors at a resonant frequency and an anti-resonant frequency can be largely increased when compared to the conventional structure of using a single layer of a piezoelectric substrate. That is, since an acoustic wave resonator with a higher quality factor can be configured, a filter with a smaller insertion loss can be configured by using the acoustic wave resonator.

The high-acoustic-velocity support substrate 51 may have a laminated structure including a support substrate and a high-acoustic-velocity film in which an acoustic velocity of a propagating bulk wave is higher than an acoustic velocity of an acoustic wave such as a surface acoustic wave and a boundary wave which propagates in/on the piezoelectric film 53. In this case, as the support substrate, piezoelectric material (for example, sapphire, lithium tantalate, lithium niobate, and crystal), various ceramics (for example, alumina, magnesia, silicon nitride, aluminum nitride, silicon carbide, zirconia, cordierite, mullite, steatite, and forsterite), a dielectric (for example, glass), a semiconductor (for example, silicon and gallium nitride), or a resin substrate may be used. Furthermore, for the high-acoustic-velocity film, for example, various high-acoustic-velocity material such as aluminum nitride, aluminum oxide, silicon carbide, silicon nitride, silicon oxynitride, a DLC film, diamond, a medium whose major component is such a material, or a medium whose major component is a mixture of these materials may be used.

Figure 2B:
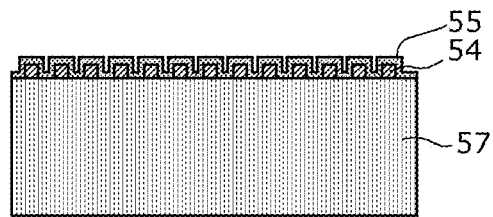
FIG. 2B is a sectional view illustrating a second example of a structure of an acoustic wave resonator according to a preferred embodiment of the present invention.

Moreover, FIG. 2B is a sectional view schematically illustrating a second example of the structure of the acoustic wave resonator according to the present preferred embodiment. In the acoustic wave resonator 100 illustrated in FIG. 2A, the example in which the IDT electrode 54 is provided on the substrate 5 including the piezoelectric film 53 is illustrated. However, the substrate where the IDT electrode 54 is provided may be a piezoelectric single crystal substrate 57 made of a single layer of a piezoelectric layer as illustrated in FIG. 2B. For example, the piezoelectric single crystal substrate 57 is made of a LiNbO$_3$ piezoelectric single crystal. The acoustic wave resonator 100 according to this example includes, for example, the LiNbO$_3$ piezoelectric single crystal substrate 57, the IDT electrode 54, and the protection layer 55 provided on the piezoelectric single crystal substrate 57 and the IDT electrode 54.

The multilayer structure, the material, the cut-angles, and the thickness of the piezoelectric film 53 and the piezoelectric single crystal substrate 57 described above may suitably be changed in accordance with, for example, required bandpass characteristics of the acoustic wave filter device. The acoustic wave resonator 100 using, for example, an LiTaO$_3$ piezoelectric substrate having cut-angles different from the cut-angles described above can also achieve advantageous effects similar to the acoustic wave resonator 100 using the piezoelectric film 53 described above.

Moreover, the substrate where the IDT electrode 54 is provided may have a structure in which a support substrate, an energy confining layer, and a piezoelectric film are laminated in this order. The IDT electrode 54 is provided on the piezoelectric film. For the piezoelectric film, for example, an LiTaO$_3$ piezoelectric single crystal or piezoelectric ceramics is used. The support substrate supports the piezoelectric film, the energy confining layer, and the IDT electrode 54.

The energy confining layer includes one or a plurality of layers, and a velocity of an acoustic bulk wave which propagates in at least one of the layers is higher than a velocity of an acoustic wave which propagates near the piezoelectric film. For example, a multilayer structure of a low-acoustic-velocity layer and a high-acoustic-velocity layer is possible. The low-acoustic-velocity layer is a film in which an acoustic velocity of a bulk wave in the lowacoustic-velocity layer is lower than an acoustic velocity of an acoustic wave which propagates in/on the piezoelectric film. The high-acoustic-velocity layer is a film in which an acoustic velocity of a bulk wave in the high-acoustic-velocity layer is higher than an acoustic velocity of an acoustic wave which propagates in/on the piezoelectric film. The support substrate may define and function as a high-acoustic-velocity layer.

Moreover, the energy confining layer may be an acoustic impedance layer having a structure in which a low-acoustic-impedance layer with a relatively low acoustic impedance and a high-acoustic-impedance layer with a relatively high acoustic impedance are laminated alternately.

Here, one example (Example) of electrode parameters of the IDT electrode which defines the acoustic wave resonator 100 is described.

A wavelength of the acoustic wave resonator is defined by a wavelength λ which is a repetition period of the plurality of electrode fingers 150a or 150b which define the IDT electrode 54 illustrated in (b) in FIG. 2A. Moreover, an electrode finger pitch is about ½ of the wavelength A, and is defined by (W+S) when a line width of the electrode fingers 150a and 150b which define the comb-shaped electrodes 100a and 100b is W, and a spacing width between the electrode finger 150a and the electrode finger 150b adjacent to each other is S. Moreover, an intersecting width L of the pair of comb-shaped electrodes 100a and 100b is, as illustrated in (a) in FIG. 2A, an overlapping length of the electrode finger 150a and the electrode finger 150b when seen in the acoustic wave propagation direction (X-axis direction). Moreover, an electrode duty ratio of each acoustic wave resonator is an occupancy ratio of the line width of the plurality of electrode fingers 150a and 150b, is a ratio of the line width of the plurality of electrode fingers 150a and 150b to an added value of the line width and the spacing width, and is defined by W/(W+S). Moreover, a height of the comb-shaped electrodes 100a and 100b is h. Below, parameters related to the shape of the IDT electrode of the acoustic wave resonator, such as the wavelength A, the electrode finger pitch, the intersecting width L, the electrode duty ratio, and the height h of the IDT electrode 54, are defined as electrode parameters.

3. Operating Principle of Acoustic Wave Filter

Next, an operating principle of the ladder acoustic wave filter 1 according to the present preferred embodiment is described.

Figure 3A:
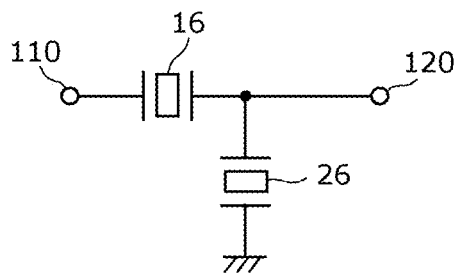
FIGS. 3A and 3B are circuit configuration diagrams for explaining a basic operating principle of a ladder acoustic wave filter, and a graph showing frequency characteristics.
Figure 3B:
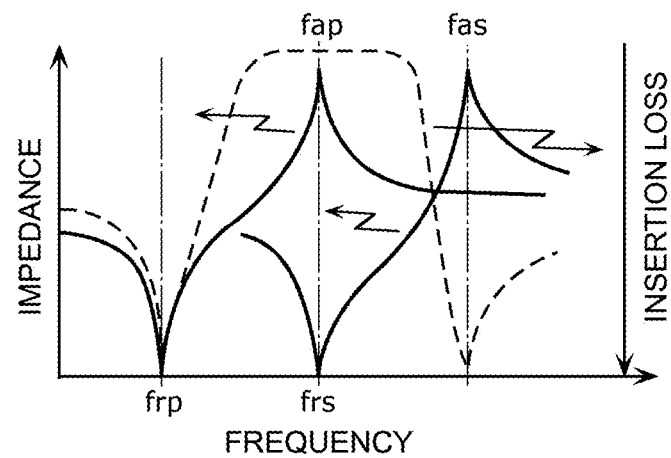

FIGS. 3A and 3B are circuit configuration diagrams for explaining a basic operating principle of a ladder acoustic wave filter, and a graph showing frequency characteristics. The operating principle illustrated in FIGS. 3A and 3B shows an operating principle of the filter circuit in the acoustic wave filter 1 according to the present preferred embodiment.

The acoustic wave filter illustrated in in FIG. 3A is a basic ladder filter including one series-arm resonator 16 and one parallel-arm resonator 26. As illustrated in in FIG. 3B, the parallel-arm resonator 26 has a resonant frequency frp and an anti-resonant frequency fap (>frp) in its resonant characteristics. Moreover, the series-arm resonator 16 has a resonant frequency frs and an anti-resonant frequency fas (>frs>frp) in its resonant characteristics.

When configuring a band pass filter using a ladder acoustic wave resonator, generally, the anti-resonant frequency fap of the parallel-arm resonator 26 and the resonant frequency frs of the series-arm resonator 16 are brought closer to each other. Therefore, the vicinity of the resonant frequency frp where impedance of the parallel-arm resonator 26 approaches zero becomes a lower-frequency-side stop-band range (lower-frequency-side attenuation band). Moreover, therefore, when the frequency increases further from this range, the impedance of the parallel-arm resonator 26 increases at the vicinity of the anti-resonant frequency fap and the impedance of the series-arm resonator 16 approaches zero at the vicinity of the resonant frequency frs. Therefore, the vicinity from the anti-resonant frequency fap to the resonant frequency frs becomes a signal pass range (pass band) in a signal path from the input-and-output terminal 110 to the input-and-output terminal 120. Thus, the pass band reflecting the electrode parameters and an electromechanical coupling coefficient of the acoustic wave resonator can be provided. Furthermore, when the frequency increases and reaches near the anti-resonant frequency fas, the impedance of the series-arm resonator 16 increases and becomes a higher-frequency-side stop-band range (higher-frequency-side attenuation band).

In the acoustic wave filter having the operating principle described above, when a high frequency signal is inputted from the input-and-output terminal 110, a potential difference is caused between the input-and-output terminal 110 and a reference terminal, and thus the piezoelectric layer is strained and a surface acoustic wave is generated. Here, by the wavelength A of the IDT electrode 54 and a wavelength of the pass band being substantially conformed to each other, only a high frequency signal having a frequency component desired to be passed passes the acoustic wave filter.

The number of resonant stages defined by the parallel-arm resonator and the series-arm resonator is suitably optimized in accordance with the desired specifications. Generally, when an acoustic wave filter includes a plurality of resonant stages, anti-resonant frequencies fap of a plurality of parallel-arm resonators and resonant frequencies frs of a plurality of series-arm resonators are in or at the vicinity of the pass band. Moreover, resonant frequencies frp of the plurality of parallel-arm resonators are in the lower-frequency-side stop-band range and anti-resonant frequencies fas of the plurality of series-arm resonators are in the higher-frequency-side stop-band range.

4. Characteristic Comparison Between Acoustic Wave Filters According to Example and Comparative Example Next, a characteristic comparison between the acoustic wave filter 1 according to the present preferred embodiment (Example) and an acoustic wave filter 500 according to Comparative Example 1 is described.

Figure 4:
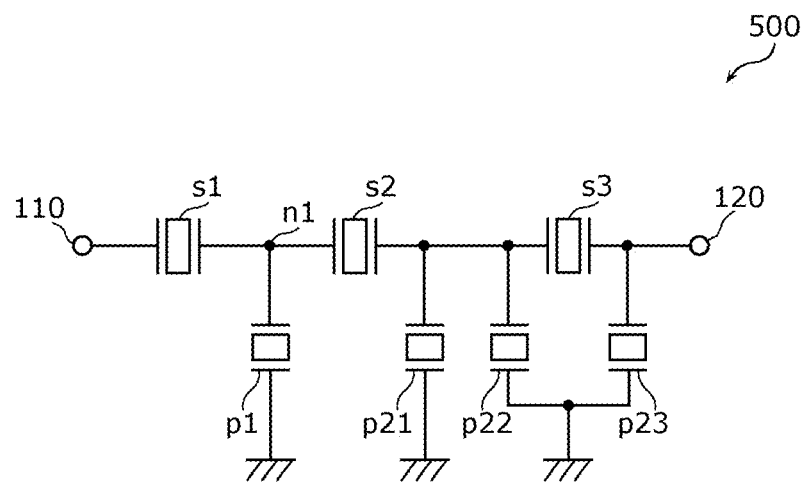
FIG. 4 is a circuit configuration diagram of an acoustic wave filter according to Comparative Example 1.

FIG. 4 is a circuit configuration diagram of the acoustic wave filter 500 according to Comparative Example 1. Meanwhile, a circuit configuration of the acoustic wave filter 1 according to Example is the same or substantially the same as the circuit configuration illustrated in FIG. 1. Reflectors are disposed at positions adjacent to the acoustic wave resonators 11 and 12 in the acoustic wave propagation direction in the canceling circuit 10 of the acoustic wave filter 1 according to Example.

As illustrated in FIG. 4, the acoustic wave filter 500 according to Comparative Example 1 includes the input-and-output terminals 110 and 120, the series-arm resonators s1, s2, and s3, and parallel-arm resonators p1, p21, p22, and p23. The acoustic wave filter 500 according to Comparative Example 1 is different from the acoustic wave filter 1 according to Example in that the parallel-arm resonator p1 is provided instead of the canceling circuit 10. That is, the acoustic wave filter 500 according to Comparative Example 1 is a ladder acoustic wave filter without a canceling circuit.

Table 1 shows substantial parameters of the acoustic wave filters according to Example and Comparative Example 1.

TABLE 1

| | Example | Comparative Example 1 |
|---|---|---|
| Utilized acoustic wave | Low acoustic velocity Rayleigh wave | |
| Pass band | Band 12 Uplink: 699-716 MHz | |
| Canceling circuit configuration | Reflector/acoustic wave resonator 11/acoustic wave resonator 12/reflector | N/A |
| Electrode finger pitch (μm) | 4.454/4.454/4.454/4.454 | |
| Number of pairs (pairs) | 5/95/5/5 | |
| Intersecting width (μm) | 197 | |

The parameters described in Table 1 are merely example, and are not limited to the numerical values shown in Table 1. For example, the electrode finger pitch of each of the acoustic wave resonators 11 and 12 and the reflectors which define the canceling circuit 10 may be different. Moreover, the magnitude relationship of the numbers of pairs in the acoustic wave resonators 11 and 12 may be opposite. However, a canceling signal generated in the canceling circuit 10 in an opposite or substantially opposite phase is significantly smaller than a pass band signal which passes the first path. Therefore, the number of pairs in the acoustic wave resonator 12 on a side of taking out the canceling signal is preferably smaller than the number of pairs in the acoustic wave resonator 11.

Figure 5:
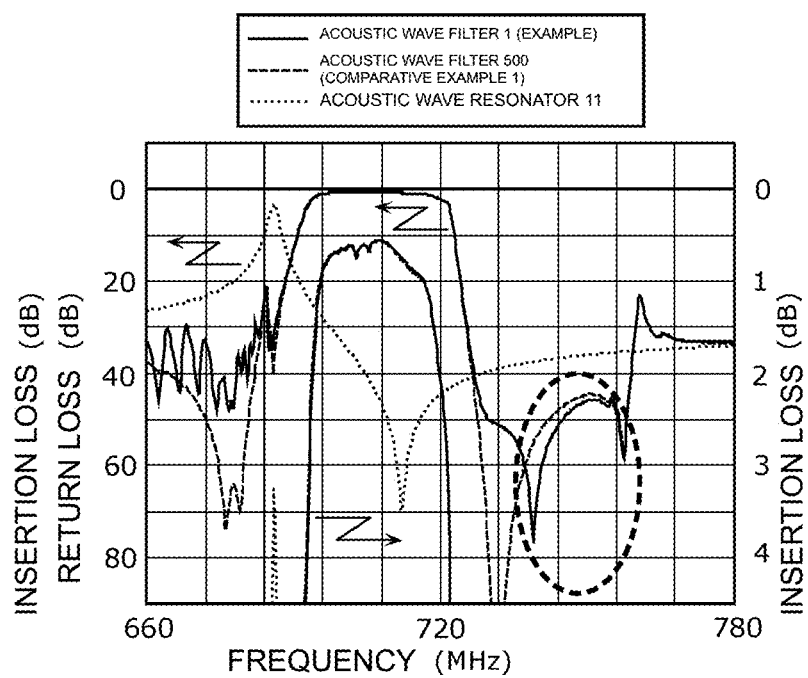
FIG. 5 is a graph comparing bandpass characteristics of an acoustic wave filters according to a preferred embodiment of the present invention and Comparative Example 1.

FIG. 5 is a graph in which bandpass characteristics of the acoustic wave filter 1 according to Example and the acoustic wave filter 500 according to Comparative Example 1 are compared. FIG. 5 shows bandpass characteristics (insertion loss: solid line) between the input-and-output terminal 110 and the input-and-output terminal 120 of the acoustic wave filter 1, bandpass characteristics (insertion loss: rough broken line) between the input-and-output terminal 110 and the input-and-output terminal 120 of the acoustic wave filter 500, and reflection characteristics (return loss: thin broken line) when seen from the node n1 of the acoustic wave resonator 11 provided to the acoustic wave filter 1.

As illustrated in FIG. 5, both the bandpass characteristics of the acoustic wave filter 1 according to Example and the acoustic wave filter 500 according to Comparative Example 1 show small loss in the pass band (for example about 699 MHz to about 716 MHz), and there is no significant difference can be seen. The reason for this can be understood that the acoustic wave resonator 11 of the acoustic wave filter 1 has a function the same as or similar to the parallel-arm resonator p1 of the acoustic wave filter 500. That is, as indicated in the reflection characteristics of the acoustic wave resonator 11, the anti-resonant frequency which is the local maximum point of the return loss is in the pass band of the acoustic wave filter 1, and the resonant frequency which is the local minimum point of the return loss is on the lower frequency side than the pass band of the acoustic wave filter 1. In other words, the acoustic wave resonator 11 defines and functions as a parallel-arm resonator which defines the ladder acoustic wave filter 1.

On the other hand, in an attenuation band (for example, downlink of Band 12: about 729 MHz to about 746 MHz) on the higher frequency side of the pass band of the acoustic wave filter 1 according to Example and the acoustic wave filter 500 according to Comparative Example 1, attenuation is larger in the acoustic wave filter 1 than in the acoustic wave filter 500. The reason for this can be considered that the canceling circuit 10 provided to the acoustic wave filter 1 generates a canceling signal in a phase substantially opposite from a signal which passes the first path in the attenuation band, and reduces or prevents the signal which passes the first path in the attenuation band.

Figure 6:
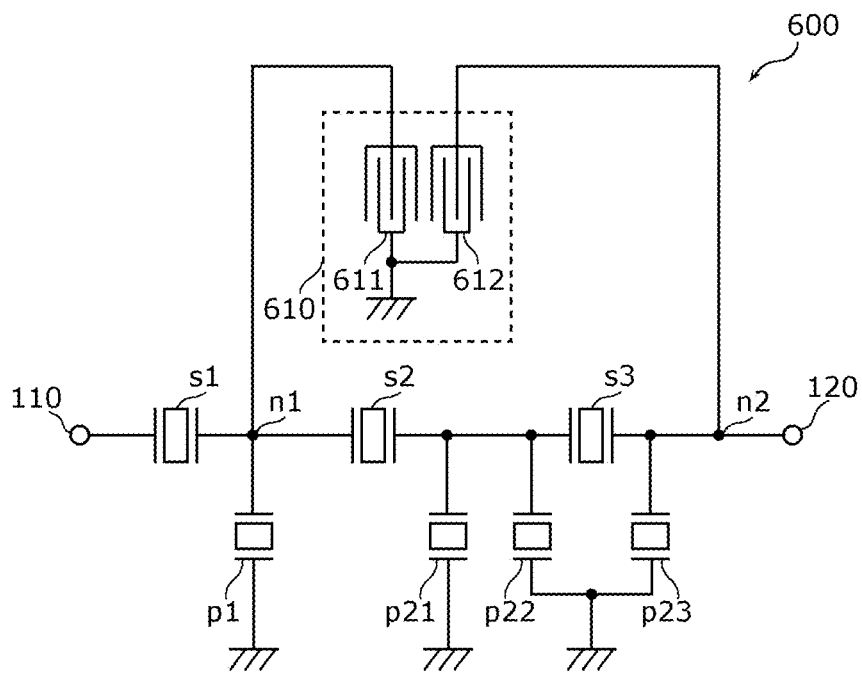
FIG. 6 is a circuit configuration diagram of an acoustic wave filter according to Comparative Example 2.

FIG. 6 is a circuit configuration diagram of an acoustic wave filter 600 according to Comparative Example 2. As illustrated in FIG. 6, the acoustic wave filter 600 according to Comparative Example 2 includes the input-and-output terminals 110 and 120, the series-arm resonators s1, s2, and s3, the parallel-arm resonators p1, p21, p22, and p23, and a canceling circuit 610. The acoustic wave filter 600 according to Comparative Example 2 is different from the acoustic wave filter 1 according to Example in that the parallel-arm resonator p1 and the canceling circuit 610 are provided instead of the canceling circuit 10. Moreover, the acoustic wave filter 600 according to Comparative Example 2 is different from the acoustic wave filter 500 according to Comparative Example 1 in that the canceling circuit 610 is added.

The canceling circuit 610 is one example of an additional circuit and includes longitudinally coupled acoustic wave resonators 611 and 612 disposed on the second path connecting the node n1 and the node n2. The acoustic wave resonators 611 and 612 are disposed in parallel or substantially in parallel in the acoustic wave propagation direction. Each of the acoustic wave resonators 611 and 612 is an acoustic wave resonator including an IDT electrode provided on a substrate having piezoelectricity. The IDT electrode which defines the acoustic wave resonator 611 includes two comb-shaped electrodes opposed to each other. One comb-shaped electrode is connected to the node n1 and the other comb-shaped electrode is connected to the ground. Moreover, the IDT electrode which defines the acoustic wave resonator 612 includes two comb-shaped electrodes opposed to each other. One comb-shaped electrode is connected to the node n2 and the other comb-shaped electrode is connected to the ground. Anti-resonant frequencies of the acoustic wave resonators 611 and 612 are outside the pass band of the filter circuit.

In the configuration described above, the canceling circuit 610 generates, in the acoustic wave resonators 611 and 612, a canceling signal in a phase opposite or substantially opposite from a signal which passes the filter circuit in a given frequency band. Therefore, the canceling circuit 610 reduces or prevents the signal which flows on the first path in the given frequency band, and can improve attenuation of the filter circuit in the given attenuation band. Bandpass characteristics between the input-and-output terminal 110 and the input-and-output terminal 120 of the acoustic wave filter 600 according to Comparative Example 2 are the same as or similar to the bandpass characteristics between the input-and-output terminal 110 and the input-and-output terminal 120 of the acoustic wave filter 1 illustrated in FIG. 5.

In the conventional acoustic wave filter, similarly to the acoustic wave filter 600 according to Comparative Example 2, an anti-resonant frequency of an acoustic wave resonator which defines a canceling circuit is not in a pass band of the acoustic wave filter.

On the other hand, in the acoustic wave filter 1 according to Example, the anti-resonant frequency of the acoustic wave resonator 11 which defines the canceling circuit 10 is in the pass band of the acoustic wave filter 1. Therefore, the acoustic wave resonator 11 is made to function as the parallel-arm resonator of the ladder filter. Moreover, by the canceling signal in the opposite or substantially opposite phase being taken out from the acoustic wave resonator 12 which is different from the acoustic wave resonator 11, an unnecessary signal which flows in the first path can be reduced or prevented while wiring connecting the canceling circuit 10 to the first path and used only for taking out the canceling signal is reduced. Therefore, the acoustic wave filter 1 according to Example can omit at least one parallel-arm resonator compared to the acoustic wave filter 600 according to Comparative Example 2, and thus can achieve a reduction in size while improving attenuation characteristics in a given frequency band.

In the acoustic wave filter 1 according to Example, not only the acoustic wave resonator 11 but also the acoustic wave resonator 12 may define and function as the parallel-arm resonator of the ladder filter. That is, the anti-resonant frequency of the acoustic wave resonator 12 may be in the pass band of the filter circuit. In other words, in the acoustic wave filter 1, each of the plurality of acoustic wave resonators which define the canceling circuit 10 may define and function as the parallel-arm resonator.

In this configuration, since the number of parallel-arm resonators in the ladder filter circuit can be further reduced, a reduction in size can further be promoted. Moreover, since the canceling signal in the opposite or substantially opposite phase can be outputted from a plurality of nodes, attenuation characteristics of the filter circuit can be improved with high accuracy.

Moreover, in the acoustic wave filter 1 according to Example, when the acoustic wave resonator 12 defines and functions as the parallel-arm resonator of the ladder filter, two parallel-arm resonators are connected to the node n2 on the wiring connecting the series-arm resonator s3 and the input-and-output terminal 120. That is, the acoustic wave filter 1 may include a plurality of parallel-arm resonators connected to the node n2, and one of the plurality of parallel-arm resonators may function as the longitudinally coupled-type acoustic wave resonator.

In this configuration, since a plurality of parallel-arm resonators are connected to the same node on the series arm path, attenuation in the attenuation band on the lower frequency side than the pass band of the filter circuit can be increased.

5. Characteristic Comparison of Acoustic Wave Filter 1A According to Modification 1

Figure 7:
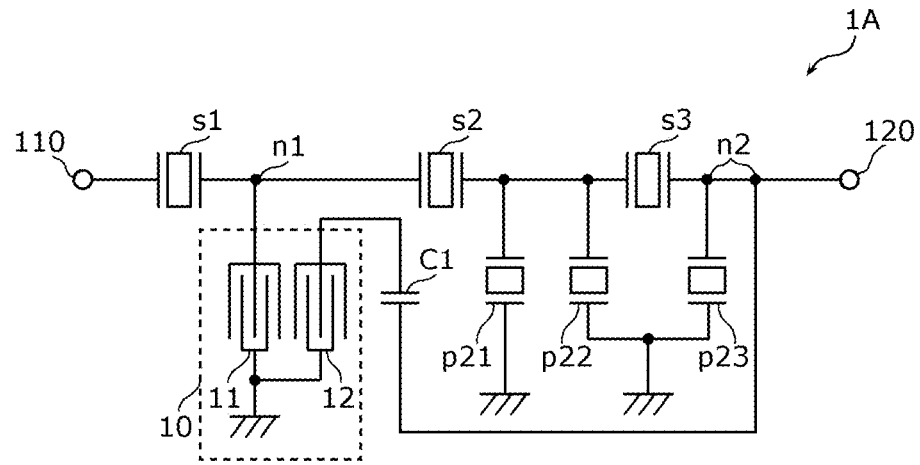
FIG. 7 is a circuit configuration diagram of an acoustic wave filter according to Modification 1 of a preferred embodiment of the present invention.

FIG. 7 is a circuit configuration diagram of an acoustic wave filter 1A according to Modification 1 of a preferred embodiment of the present invention. As illustrated in FIG. 7, the acoustic wave filter 1A according to Modification 1 includes the input-and-output terminals 110 and 120, the series-arm resonators s1, s2, and s3, the parallel-arm resonators p21, p22, and p23, the canceling circuit 10, and a capacitance element C1. The acoustic wave filter 1A according to Modification 1 is different from the acoustic wave filter 1 according to Example in that the capacitance element C1 is added. Below, regarding the acoustic wave filter 1A according to Modification 1, configurations the same or substantially the same as the acoustic wave filter 1 according to Example are omitted, and description is made focusing on different configurations.

The canceling circuit 10 includes the acoustic wave resonators 11 and 12 disposed on the second path connecting the node n1 and the node n2.

The capacitance element C1 is one example of a reactance element and is connected between the acoustic wave resonator 12 and the node n2. The capacitance element C1 adjusts impedance when the canceling circuit 10 is seen from the node n2, and thus can adjust amplitude and a phase of the canceling signal generated in the canceling circuit 10.

The IDT electrode which defines the acoustic wave resonator 11 includes two comb-shaped electrodes opposed to each other. One comb-shaped electrode is connected to the node n1 and the other comb-shaped electrode is connected to the ground. Moreover, the IDT electrode which defines the acoustic wave resonator 12 includes two comb-shaped electrodes opposed to each other. One comb-shaped electrode is connected to one end of the capacitance element C1 and the other comb-shaped electrode is connected to the ground. The other end of the capacitance element C1 is connected to the node n2.

In the configuration described above, the capacitance element C1 can adjust the phase and amplitude of the canceling signal generated in the canceling circuit 10. Therefore, attenuation characteristics of the acoustic wave filter 1A can be improved with high accuracy.

The capacitance element C1 may be connected between the acoustic wave resonator 11 and the node n1, or alternatively, it may be disposed at both of between the acoustic wave resonator 11 and the node n1, and between the acoustic wave resonator 12 and the node n2. Moreover, the capacitance element C1 may be an inductance element.

6. Characteristic Comparison of Acoustic Wave Filter 1B According to Modification 2

Figure 8:
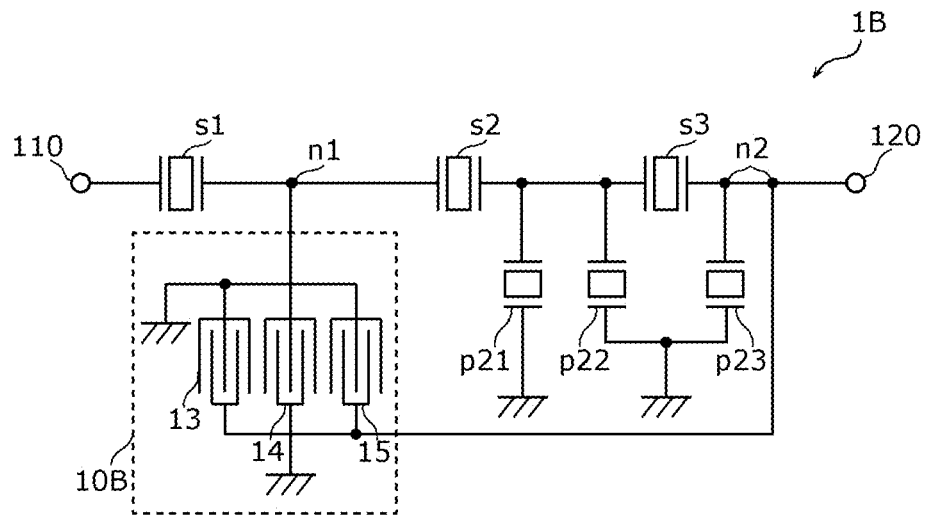
FIG. 8 is a circuit configuration diagram of an acoustic wave filter according to Modification 2 of a preferred embodiment of the present invention.

FIG. 8 is a circuit configuration diagram of an acoustic wave filter 1B according to Modification 2 of a preferred embodiment of the present invention. As illustrated in FIG. 8, the acoustic wave filter 1B according to Modification 2 includes the input-and-output terminals 110 and 120, the series-arm resonators s1, s2, and s3, the parallel-arm resonators p21, p22, and p23, and a canceling circuit 10B. In the acoustic wave filter 1B according to Modification 2, a circuit configuration of canceling circuit 10B is different when compared to the acoustic wave filter 1 according to Example. Below, regarding the acoustic wave filter 1B according to Modification 2, configurations the same or substantially the same as the acoustic wave filter 1 according to Example are omitted, and description is made focusing on different configurations.

The canceling circuit 10B is one example of an additional circuit and includes three acoustic wave resonators 13, 14, and 15 disposed on the second path connecting the node n1 and the node n2. Each of the acoustic wave resonators 13, 14, and 15 is one example of the first acoustic wave resonator, and they are disposed in this order in the acoustic wave propagation direction. Each of the acoustic wave resonators 13, 14, and 15 is an acoustic wave resonator including an IDT electrode provided on a substrate having piezoelectricity.

The IDT electrode which defines the acoustic wave resonator 14 includes two comb-shaped electrodes opposed to each other. One comb-shaped electrode is connected to the node n1 and the other comb-shaped electrode is connected to the ground. Moreover, the IDT electrode which defines the acoustic wave resonator 13 includes two comb-shaped electrodes opposed to each other. One comb-shaped electrode is connected to the node n2 and the other comb-shaped electrode is connected to the ground. Moreover, the IDT electrode which defines the acoustic wave resonator 15 includes two comb-shaped electrodes opposed to each other. One comb-shaped electrode is connected to the node n2 and the other comb-shaped electrode is connected to the ground. Reflectors may be disposed at positions adjacent to the acoustic wave resonators 13 to 15 in the acoustic wave propagation direction.

In the configuration described above, in the canceling circuit 10B, variations of generating a canceling signal in a phase substantially opposite from a high frequency signal which flows in the filter circuit in a given attenuation band increase. Therefore, attenuation characteristics of the acoustic wave filter 1B can further be improved.

Figure 9:
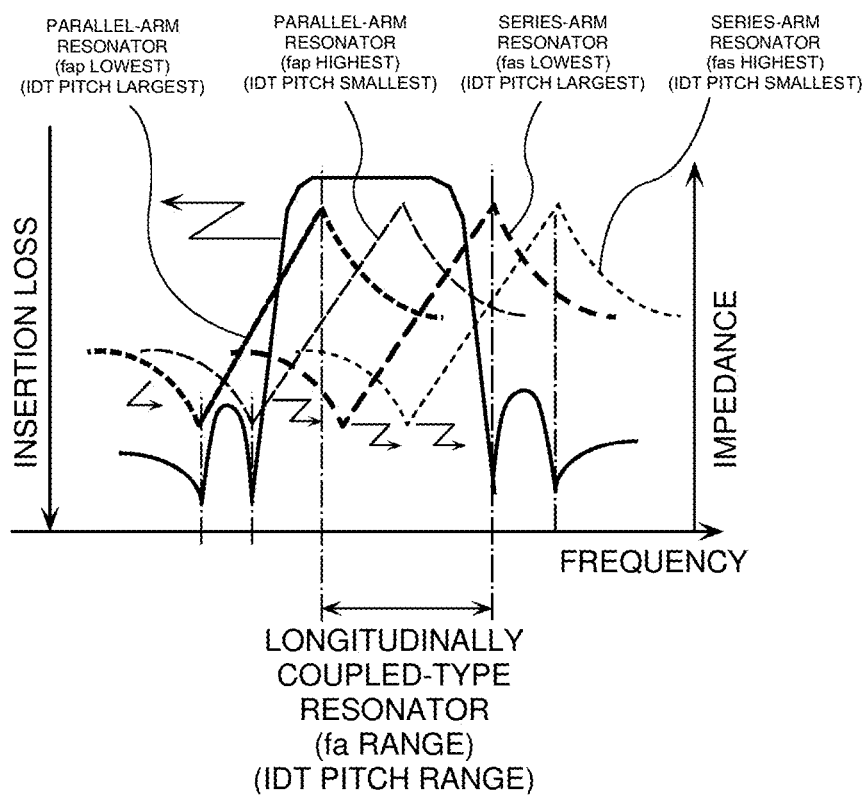
FIG. 9 is a diagram for explaining a relationship between IDT pitches of a longitudinally coupled acoustic wave resonator, a parallel-arm resonator, and a series-arm resonator of the acoustic wave filter according to a preferred embodiment of the present invention.

7. Relationship Between IDT Pitches of Longitudinally Coupled-type Acoustic Wave Resonator, Parallel-arm Resonator, and Series-arm Resonator FIG. 9 is a diagram for explaining a relationship between IDT pitches of a longitudinally coupled acoustic wave resonator, a parallel-arm resonator, and a series-arm resonator of the acoustic wave filter 1 according to the above-described preferred embodiment. As illustrated in FIG. 9, the anti-resonant frequencies fas of the plurality of series-arm resonators s1, s2, and s3 are positioned around the higher frequency side of the pass band of the filter circuit. Among these, the series-arm resonator whose anti-resonant frequency fas is closer to the pass band has the larger IDT pitch. Moreover, the anti-resonant frequencies fap of the plurality of parallel-arm resonators p21, p22, and p23 are in the pass band of the filter circuit. Among these, the parallel-arm resonator whose anti-resonant frequency fap is on the lower frequency side has the larger IDT pitch.

Therefore, the anti-resonant frequency of at least one of the plurality of acoustic wave resonators 11 and 12 is preferably positioned between the lowest anti-resonant frequency among the anti-resonant frequencies of the plurality of parallel-arm resonators, and the lowest anti-resonant frequency among the anti-resonant frequencies of the plurality of series-arm resonators.

That is, the electrode finger pitch of the IDT electrode provided to at least one of the plurality of acoustic wave resonators 11 and 12 is preferably the same as or larger than the electrode finger pitch of the IDT electrode provided to the series-arm resonator whose anti-resonant frequency (fas) is the lowest among the plurality of series-arm resonators s1, s2, and s3, and the same as or smaller than the electrode finger pitch of the IDT electrode provided to the parallel-arm resonator whose anti-resonant frequency (fap) is the lowest among the plurality of parallel-arm resonators p21, p22, and p23.

In this configuration, the canceling circuit 10 can improve attenuation of the filter circuit in the given attenuation band, and since at least one of the acoustic wave resonators 11 and 12 can define and function as the parallel-arm resonator of the filter circuit, the number of parallel-arm resonators of the filter circuit can be reduced. Thus, the acoustic wave filter 1 with improved attenuation characteristics and reduced in size can be achieved.

In the present preferred embodiment, the IDT pitch of each acoustic wave resonator is an average of pitches of two electrode fingers adjacent to each other in the IDT electrode which constitutes the acoustic wave resonator. The averaged IDT pitch is obtained by, for example, dividing the dimension of the IDT electrode in the acoustic wave propagation direction by the number of electrode fingers.

Advantageous Effects

The acoustic wave filter 1 according to the above-described preferred embodiment includes the filter circuit connected to the input-and-output terminals 110 and 120, and the canceling circuit 10 connected in parallel to at least a portion of the first path connecting the input-and-output terminal 110 and the input-and-output terminal 120. The filter circuit includes one or more series-arm resonators disposed on the first path, and one or more parallel-arm resonators disposed between the first path and the ground. The canceling circuit 10 includes the longitudinally coupled acoustic wave resonators 11 and 12 in parallel or substantially in parallel in the propagation direction of an acoustic wave. At least one of the acoustic wave resonators 11 and 12 is connected to the ground, and an anti-resonant frequency of the at least one is in the pass band of the filter circuit.

In the configuration described above, the canceling circuit 10 can improve attenuation of the filter circuit in a given attenuation band. Moreover, since at least one of the acoustic wave resonators 11 and 12 can define and function as the parallel-arm resonator which should be disposed between the node n1 and the ground of the filter circuit, the number of parallel-arm resonators of the filter circuit can be reduced. Thus, the acoustic wave filter 1 with improved attenuation characteristics and reduced in size can be achieved.

Moreover, in the acoustic wave filter 1, a resonant frequency of at least one of the acoustic wave resonators 11 and 12 may be on the lower frequency side than the pass band of the filter circuit.

In this configuration, since at least one of the acoustic wave resonators 11 and 12 can define and function as the parallel-arm resonator of the filter circuit, attenuation of the filter circuit in the attenuation band on the lower frequency side can be improved.

Moreover, in the acoustic wave filter 1, at least one of the acoustic wave resonators 11 and 12 may be one of the one or more parallel-arm resonators which define the filter circuit.

In this configuration, since at least one of the acoustic wave resonators 11 and 12 can also be used as the parallel-arm resonator, the acoustic wave filter 1 can be reduced in size.

Moreover, in the acoustic wave filter 1, the acoustic wave resonators 11 and 12 may define an acoustic wave resonator.

In this configuration, in the canceling circuit, a high frequency signal in a phase opposite or substantially opposite from a high frequency signal which flows in the filter circuit in a given attenuation band is easily generated, and the high frequency signal which flows in the filter circuit in the given attenuation band can effectively be reduced or prevented.

Moreover, in the acoustic wave filter 1B according to Modification 2, the canceling circuit 10B may include three longitudinally coupled acoustic wave resonators.

In this configuration, in the canceling circuit 10B, variations of generating a high frequency signal in a phase substantially opposite from a high frequency signal which flows in the filter circuit in a given attenuation band increase. Therefore, attenuation characteristics of the filter circuit can further be improved.

Moreover, the acoustic wave filter 1A according to Modification 1 may further include a reactance element connected to one of the acoustic wave resonators 11 and 12.

In this configuration, the reactance element can adjust the signal amplitude generated by the canceling circuit 10 in an opposite or substantially opposite phase. Therefore, attenuation characteristics of the filter circuit can be improved with high accuracy.

Moreover, in the acoustic wave filter 1, the filter circuit may include a plurality of parallel-arm resonators connected to the same node, and one of the plurality of parallel-arm resonators may be the acoustic wave resonator 12.

In this configuration, since a plurality of parallel-arm resonators are connected to the same node on the series arm path, attenuation in the attenuation band on the lower frequency side than the pass band of the filter circuit can be increased.

Moreover, in the acoustic wave filter 1, the filter circuit may include one or more series-arm resonators disposed on the first path and a plurality of parallel-arm resonators. The anti-resonant frequency of each of the acoustic wave resonators 11 and 12 may be in the pass band of the filter circuit. Each of the acoustic wave resonators 11 and 12 may be one of the plurality of parallel-arm resonators.

In this configuration, since the number of parallel-arm resonators in the ladder filter circuit can further be reduced, a reduction in size can be further promoted. Moreover, since the canceling signal in the opposite or substantially opposite phase can be outputted from a plurality of nodes, attenuation characteristics of the filter circuit can be improved with high accuracy.

Moreover, in the acoustic wave filter 1, the filter circuit may include a plurality of series-arm resonators disposed on the first path and a plurality of parallel-arm resonators. Each of the acoustic wave resonators 11 and 12, the plurality of series-arm resonators, and the plurality of parallel-arm resonators may include the IDT electrode provided on the substrate having piezoelectricity. The IDT electrode may include a pair of comb-shaped electrodes each including a plurality of electrode fingers extending in the direction intersecting with the acoustic wave propagation direction and disposed in parallel with each other, and the busbar electrode connecting one end of each of the plurality of electrode fingers. The electrode finger pitch of the IDT electrode of at least one of the acoustic wave resonators 11 and 12 may be the same as or larger than the electrode finger pitch of the IDT electrode of the series-arm resonator included in the plurality of series-arm resonators and having the lowest anti-resonant frequency, and the same as or smaller than the electrode finger pitch of the IDT electrode of the parallel-arm resonator included in the plurality of parallel-arm resonators and having the lowest anti-resonant frequency.

In this configuration, the canceling circuit 10 can improve attenuation of the filter circuit in the given attenuation band, and since at least one of the acoustic wave resonators 11 and 12 can define and function as the parallel-arm resonator of the filter circuit, the number of parallel-arm resonators of the filter circuit can be reduced. Thus, the acoustic wave filter 1 with improved attenuation characteristics and reduced in size can be achieved.

Other Modifications

Although acoustic wave filters according to preferred embodiments of the present invention and modifications thereof are described above, the acoustic wave filters of the present invention are not limited to the above-described preferred embodiments. The present invention includes other preferred embodiments achieved by combining arbitrary or optional components of the preferred embodiments, modifications obtained by applying to the preferred embodiments various changes conceivable by a person skilled in the art without departing from the scope of the present invention, and various devices including the acoustic wave filters according to the preferred embodiments therein.

The acoustic wave resonators which define the acoustic wave filters according to the preferred embodiments is, for example, a surface acoustic wave (SAW) resonator described above, and the SAW includes a boundary wave as well as a surface acoustic wave.

Moreover, an acoustic wave resonator which defines an acoustic wave filter according to a preferred embodiment may be a resonator using a bulk acoustic wave (BAW), for example.

Moreover, for example, in the acoustic wave filters, an inductor and/or a capacitor may be connected between the respective components. The inductor may include a wiring inductor which connects the respective components by wiring.

Preferred embodiments of the present invention can be widely used for, for example, communication devices such as cellular phones, as a low-loss and high-attenuation acoustic wave filter which is conformable to multi-band and multi-mode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
   a first circuit connected to a first terminal and a second terminal; and
   a second circuit connected in parallel to at least a portion of a first path connecting the first terminal and the second terminal; wherein
   the first circuit includes:
      one or more series-arm resonators on the first path; and
      one or more parallel-arm resonators between the first path and a ground;
   the second circuit includes a plurality of first acoustic wave resonators in parallel or substantially in parallel in a propagation direction of an acoustic wave;
   at least one of the plurality of first acoustic wave resonators is connected to a ground; and
   an anti-resonant frequency of the at least one of the plurality of first acoustic wave resonators is in a pass band of the first circuit.

2. The acoustic wave filter according to claim 1, wherein a resonant frequency of the at least one of the plurality of first acoustic wave resonators is on a lower frequency side than the pass band of the first circuit.

3. The acoustic wave filter according to claim 1, wherein an anti-resonant frequency of one of the plurality of first acoustic wave resonators is in the pass band of the first circuit; and
   the one of the plurality of first acoustic wave resonators is one of the one or more parallel-arm resonators.

4. The acoustic wave filter according to claim 1, wherein the plurality of first acoustic wave resonators define a longitudinally coupled resonator.

5. The acoustic wave filter according to claim 4, wherein the plurality of first acoustic wave resonators include three first acoustic wave resonators.

6. The acoustic wave filter according to claim 1, further comprising a reactance element connected to one of the plurality of first acoustic wave resonators.

7. The acoustic wave filter according to claim 1, wherein the one or more parallel-arm resonators are a plurality of parallel-arm resonators;
   two or more parallel-arm resonators among the plurality of parallel-arm resonators are connected to a same node on the first path; and
   one of the two or more parallel-arm resonators is included in the plurality of first acoustic wave resonators.

8. The acoustic wave filter according to claim 1, wherein the one or more parallel-arm resonators are a plurality of parallel-arm resonators;
   anti-resonant frequencies of two or more first acoustic wave resonators among the plurality of first acoustic wave resonators are in the pass band of the first circuit; and each of the two or more first acoustic wave resonators is included in the plurality of parallel-arm resonators.

9. The acoustic wave filter according to claim 1, wherein the first circuit includes:
   a plurality of series-arm resonators on the first path; and
   a plurality of parallel-arm resonators between the first path and a ground;
each of the plurality of first acoustic wave resonators, the plurality of series-arm resonators, and the plurality of parallel-arm resonators includes an interdigital transducer (IDT) electrode on a substrate having piezoelectricity;
the IDT electrode includes a pair of comb-shaped electrodes each including a plurality of electrode fingers and a busbar electrode, the plurality of electrode fingers extending in a direction intersecting with the propagation direction of the acoustic wave and parallel or substantially parallel with each other, the busbar electrode connecting one end of each of the plurality of electrode fingers; and
an electrode finger pitch of the IDT electrode of at least one of the plurality of first acoustic wave resonators is same as or larger than an electrode finger pitch of the IDT electrode of a series-arm resonator included in the plurality of series-arm resonators with the lowest anti-resonant frequency, and same as or smaller than an electrode finger pitch of the IDT electrode of a parallel-arm resonator included in the plurality of parallel-arm resonators with the lowest anti-resonant frequency.

10. The acoustic wave filter according to claim 9, wherein the plurality of electrode fingers extend in a direction orthogonal or substantially orthogonal to the propagation direction of the acoustic wave.

11. The acoustic wave filter according to claim 9, wherein the IDT electrode has a multilayer structure including an adhesion layer and a main electrode layer on the adhesion layer.

12. The acoustic wave filter according to claim 11, wherein the adhesion layer includes Ti.

13. The acoustic wave filter according to claim 11, wherein a thickness of the adhesion layer is about 12 nm.

14. The acoustic wave filter according to claim 11, wherein the main electrode layer includes Al including about 1% of Cu.

15. The acoustic wave filter according to claim 11, wherein a thickness of the main electrode layer is about 162 nm.

16. The acoustic wave filter according to claim 1, wherein the substrate includes a high-acoustic-velocity support substrate, a low-acoustic-velocity film, and a piezoelectric film laminated in this order.

17. The acoustic wave filter according to claim 16, wherein a thickness of the piezoelectric film is about 600 nm.

18. The acoustic wave filter according to claim 16, wherein the high-acoustic-velocity support substrate is a silicon substrate.

19. The acoustic wave filter according to claim 16, wherein a thickness of the high-acoustic-velocity support substrate is about 200 μm.

20. The acoustic wave filter according to claim 16, wherein the low-acoustic-velocity film includes silicon dioxide.

* * * * *